US006504447B1

(12) United States Patent
Laney et al.

(10) Patent No.: US 6,504,447 B1
(45) Date of Patent: Jan. 7, 2003

(54) MICROELECTROMECHANICAL RF AND MICROWAVE FREQUENCY POWER LIMITER AND ELECTROSTATIC DEVICE PROTECTION

(75) Inventors: David Laney, San Diego, CA (US); Mehran Matloubian, Encino, CA (US); Lawrence Larson, Del Mar, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 09/431,308

(22) Filed: Oct. 30, 1999

(51) Int. Cl.[7] .......................... H03G 11/04; H01P 1/10
(52) U.S. Cl. ....................... 333/17.2; 333/262; 200/181
(58) Field of Search ............................... 333/17.2, 262, 333/105, 101; 200/181

(56) References Cited

U.S. PATENT DOCUMENTS

| | | | | | |
|---|---|---|---|---|---|
| 5,619,061 | A | | 4/1997 | Goldsmith et al. | |
| 5,638,946 | A | * | 6/1997 | Zavracky | 200/181 |
| 6,020,564 | A | * | 2/2000 | Wang et al. | 200/181 |
| 6,058,229 | A | * | 5/2000 | Burrows et al. | 385/24 |
| 6,100,477 | A | * | 8/2000 | Randall et al. | 200/181 |
| 6,133,807 | A | * | 10/2000 | Akiyama et al. | 333/101 |
| 6,143,997 | A | * | 11/2000 | Feng et al. | 200/181 |
| 6,188,301 | B1 | * | 2/2001 | Kornrumpf et al. | 333/262 |
| 6,239,685 | B1 | * | 5/2001 | Albrecht et al. | 337/365 |

OTHER PUBLICATIONS

R. Holtzman, "Numerical Analysis Predicts PIN–Diode Limiter Performance", Jun. 1995, Microwaves & RF, pp. 82–85.

P. Sahjani and E. Higham, "PIN Diode Limiters Handle High–Power Input Signals", Apr. 1990, Microwaves & RF, pp. 195–199.

K. Bock, "ESD issues incompound semiconductor high–frequency devices and circuits", 1998, Microelectronics Reliability 38, pp. 1781–1793.

C. Trantella et al., "An investigation of GaAs MMIC High Power Limiters for Circuit Protection", 1997, IEEE MTT–S Digest, pp. 535–538.

David J. Seymour et al., "X–Band Monolithic GaAs PIN Diode Variable Attenuation Limiter", 1990, IEEE MT–S Digest, pp. 841–844.

T. Parra et al., "X–Band Low Phase DIstortion MMIC Power Limiter", May 1993, IEEE Transactions on Microwave Theory and Techniques, vol. 41, No. 5, pp. 876–879. 5/93.

G. Croft, J. Bernier, "ESD protection techniques for high frequency integrated circuits", Jul. 9, 1998, Microelectronics Reliability 38, pp. 1681–1689.

(List continued on next page.)

*Primary Examiner*—Robert Pascal
*Assistant Examiner*—Dean Takaoka
(74) *Attorney, Agent, or Firm*—Tope-McKay & Associates

(57) ABSTRACT

The present invention provides a flexible mechanical bridge over a microstrip on a substrate, which utilizes an electromagnetic field increase, as generated by temporary power surge to shunt harmful power away from a MMIC system. The invention includes a power limiter which includes an airbridge 11, preferably in the form of an electrically conductive strip with ground contacts 1 and 3 formed thereon. The ground contacts 1 and 2 are electrically connected, through via holes 5 and 7 respectively, to a metallization layer 15 formed on the bottom side of a substrate 9. The air bridge 11 is designed such that it traverses an electrically conductive microstrip 13 forming an air gap 16 between the air bridge 11 and the electrically conductive microstrip 13. When there is a power surge the air bridge 11, will flex to cause an electrical connection with the microstrip 13, thereby directing the unwanted signal through the ground contacts 1 and 3 and the via holes 5 and 7 to the metallization layer 15.

7 Claims, 6 Drawing Sheets

OTHER PUBLICATIONS

Masahiro Hagio et al., "Monolithis Integration of Surge Protection Diodes into Low–Noise GaAs MESFETs", May 1985, IEEE Transactions on Electron Devices, vol. ED–32, No. 5, pp. 892–895.

C. Goldsmith et al., "Characteristics of Micromachined Switches at Microwave Frequencies", 1996, IEEE MTT–S Digest, pp. 1141–1144.

Mehran Megregany, "An Overview of Microelectromechanical Systems", 1992, SPIE vol. 1793 Integrated Optics and Microstructures, pp. 2–11.

Hector J. Delos Santos et al., "Microwave and Mechanical Considerations in the Design of MEM Switches for Aerospace Applications", 1997, IEEE, pp. 235–253.

* cited by examiner

MICROELECTROMECHANICAL RF AND MICROWAVE FREQUENCY POWER LIMITER AND ELECTROSTATIC DEVICE PROTECTION

TECHNICAL FIELD

The present invention discloses an effective technique to provide protection to high frequency circuits such as, but not limited to, low-noise amplifiers (LNA's) and millimeter wave integrated circuits (MMIC's) from electrostatic disturbance and potentially damaging high-power signals utilizing a microelectomechanical (MEM) device.

BACKGROUND OF THE INVENTION

In the construction of high-frequency integrated circuits, including MMIC's, power limiters are used at the input of circuits including low noise amplifiers to prevent device burnout from undesirably high levels of incident RF power. PIN diodes are typically used as power limiters, but these diodes are lossy, particularly at millimeter-wave frequencies. Further, diodes are difficult to use as they require impedance matching to the circuitry to which they are connected and tend to break down at very high power levels. Any loss due to a power limiter adds directly to the noise figure of the circuit, resulting in reduced sensitivity to desired signals and greater power requirements for the system resulting from additional complexities of design. Additionally, it is often difficult to monolithically integrate PIN diodes with transistors in a single process while the present invention may be integrated onto the same substrate as active devices such as transistors in a high-frequency integrated circuit process.

The present invention overcomes many of the difficulties found in the use of diodes as power limiters by providing a flexible mechanical bridge over a transmission line on the substrate which utilizes the electromagnetic field increase generated by temporary increases in power to short the harmful signal away from the remainder of the circuit.

Semiconductor devices are sensitive to excessive input voltages, such as those generated by ESD. High-speed devices are particularly sensitive. Circuits and systems that encounter ESD typically suffer from either immediate or latent component failure. In low frequency applications, the most common technique for protecting the input/output/power pins from damage is to include ESD diodes to shunt the undesired input signal away from the active devices and a series resistor to allow for sufficient time for the diodes to turn on. However, ESD diodes tend to have a large capacitance which prohibits their use in RF/microwave applications, and the series resistor is not acceptable in this type of system due to the incurred loss. The result of these shortcomings in diodes and resistors leave the typical high-speed devices, which operate at high frequencies, unprotected.

In contrast, the present invention sets forth a method to utilize a mechanical cantilever type switch to serve as protection from ESD.

SUMMARY OF THE INVENTION

In accordance with the present invention, a MEM implementation of a power limiter is presented, utilizing the electromagnetic field increase caused by a substantial increase in power through a transmission line on a substrate to cause the mechanical flex of a strip of conductive material traversing the transmission line. Upon flexion, the conductive material contacts the microstrip and provides a path by which the signal is shorted to ground. As a result, devices further down the circuit are protected from damage. The MEM power limiter is low loss and can easily be integrated with low noise active devices such as HEMT's or HBT's in MMIC's. The MEM limiter is intentionally designed to actuate at high RF inputs to protect the active devices from damagingly high signals. Although the speed of the MEM power limiters will typically be less than that of PIN diode limiters, by proper design of the limiter it is possible to protect the active devices from burnout.

Also presented in accordance with the present invention, is a MEM implementation of a cantilever type switch activated by an on-board signal from an active circuit such as a MMIC which may be used to as a safety mechanism to protect high speed devices from excessive input voltages or as a switch for other purposes such as an on/off switch. The advantage of the MEM cantilever type switch is that it is causes very low losses, thereby facilitating the protection of microwave devices in a manner that does not appreciably degrade their normal performance.

DETAILED DESCRIPTION

Figure 1:
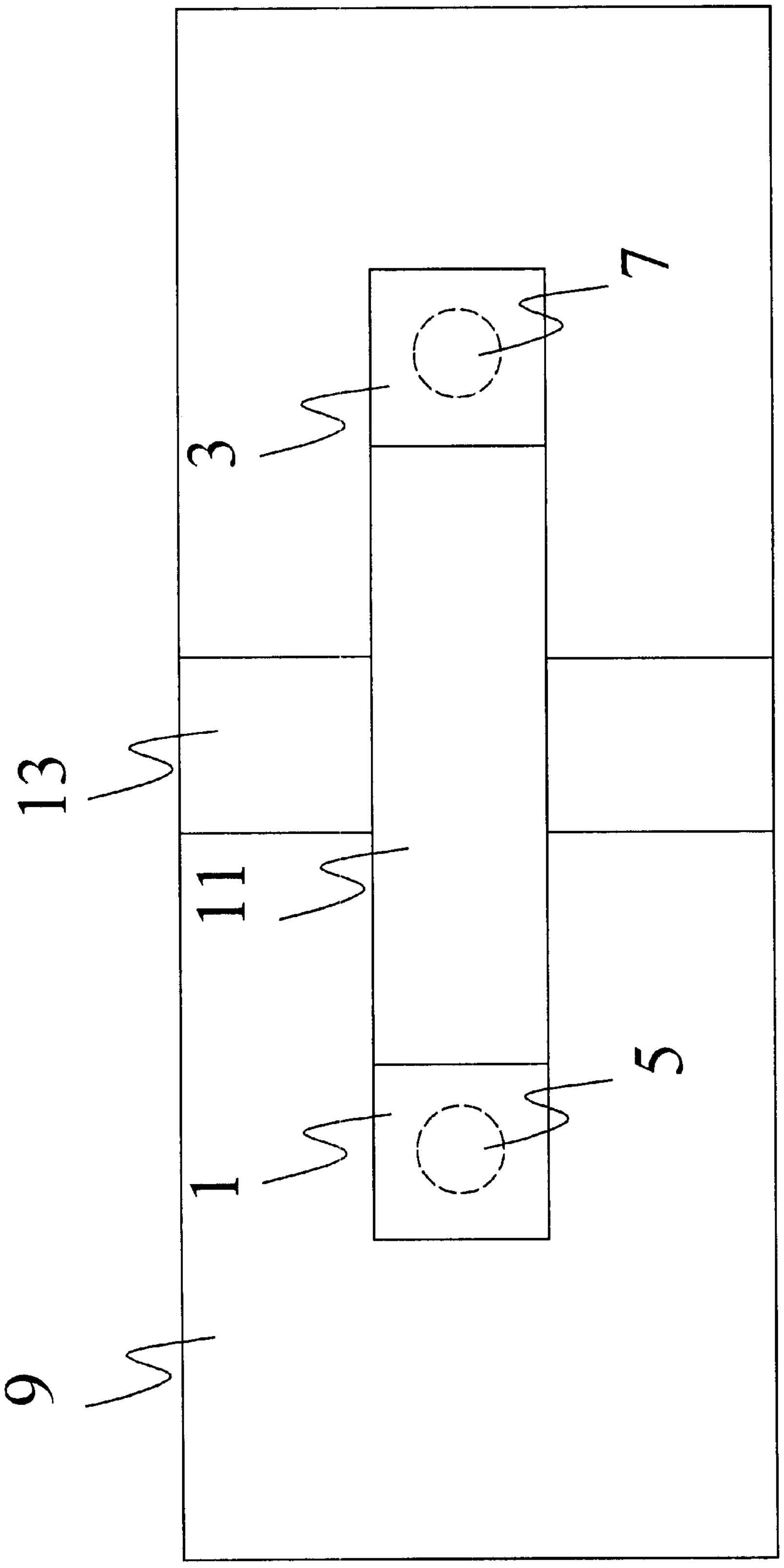
FIG. 1 is a top view of the preferred embodiment of the bridge type power limiter or ESD protection device.
Figure 2:
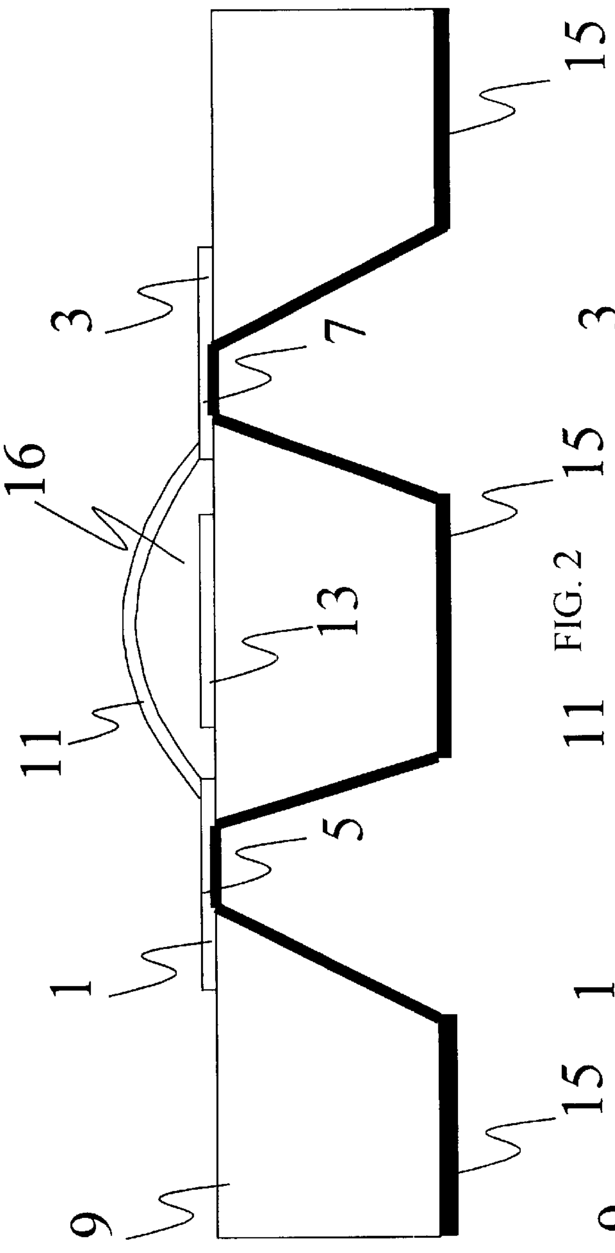
FIG. 2 is a side view of the preferred embodiment of the bridge type device, with the air bridge in the "open" position.

The proposed bridge implementation of the power limiter, as shown in FIG. 1, includes an airbridge 11, preferably in the form of an electrically conductive strip with ground contacts 1 and 3 formed thereon. The ground contacts 1 and 3 are electrically connected, through via holes 5 and 7 respectively, to a metallization layer 15 (see FIG. 2 and 3) formed on the bottom side of a substrate 9. The air bridge 11 is designed such that it traverses an electrically conductive microstrip 13, forming an air gap 16 between the air bridge 11 and the electrically conductive microstrip 13. This state occurs during normal operation when there are no signals of sufficient amplitude to activate the power limiter.

Figure 3:
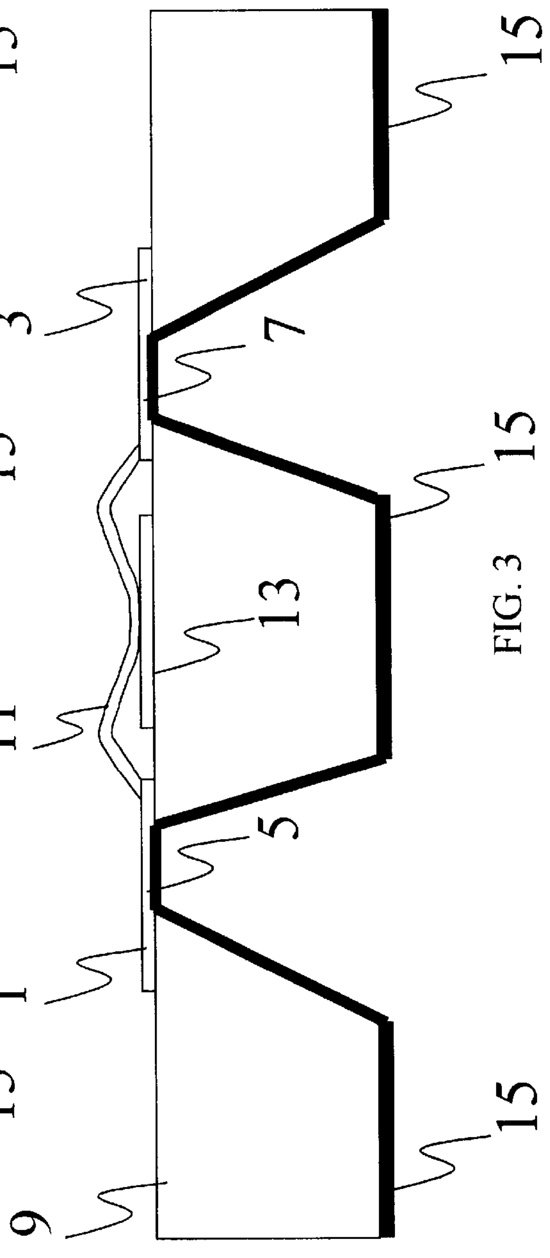
FIG. 3 is a side view of the preferred embodiment of the bridge type device, with the air bridge in the "shunt" configuration.

FIG. 3 shows the power limiter's response to an undesired signal passing along the transmission line 13. The air bridge 11, in this case, will flex to cause an electrical connection with the transmission line 13, thereby directing the unwanted signal through the ground contacts 1 and 3 and the via holes 5 and 7 to the metallization layer 15.

Figure 4:
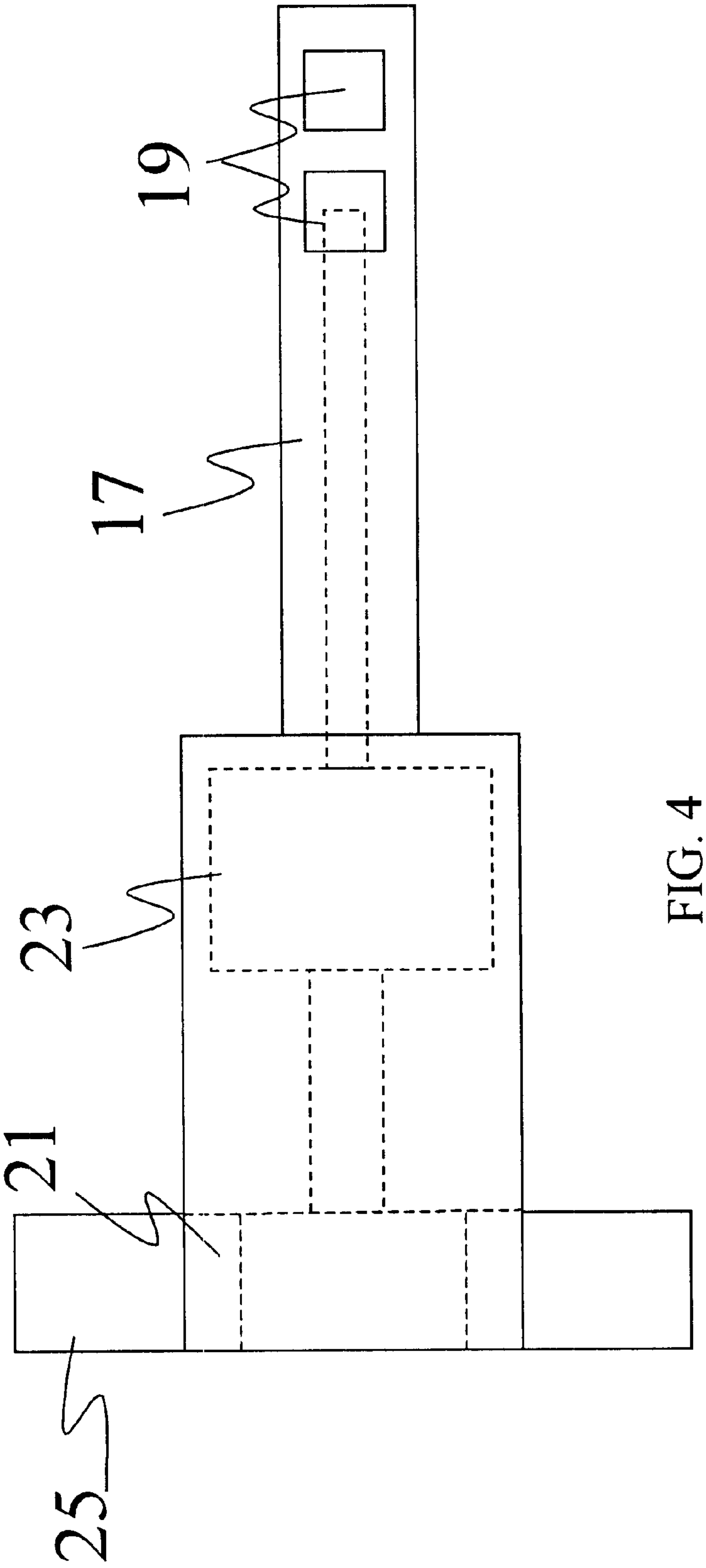
FIG. 4 is a top view of the preferred embodiment of the cantilever type power limiter or ESD protection device.

The proposed ESD protection device or power limiter as shown in FIG. 4 includes a cantilever arm 17 constructed as a rectangular lever made of an electrically neutral material such as silicon nitride, with an anchor end 19, a contact end 21 and an actuation portion 23. The contact end 21 faces and directly opposes the transmission line 25 which is embedded in the substrate 27 (see FIG. 5 and 6).

Figure 5:
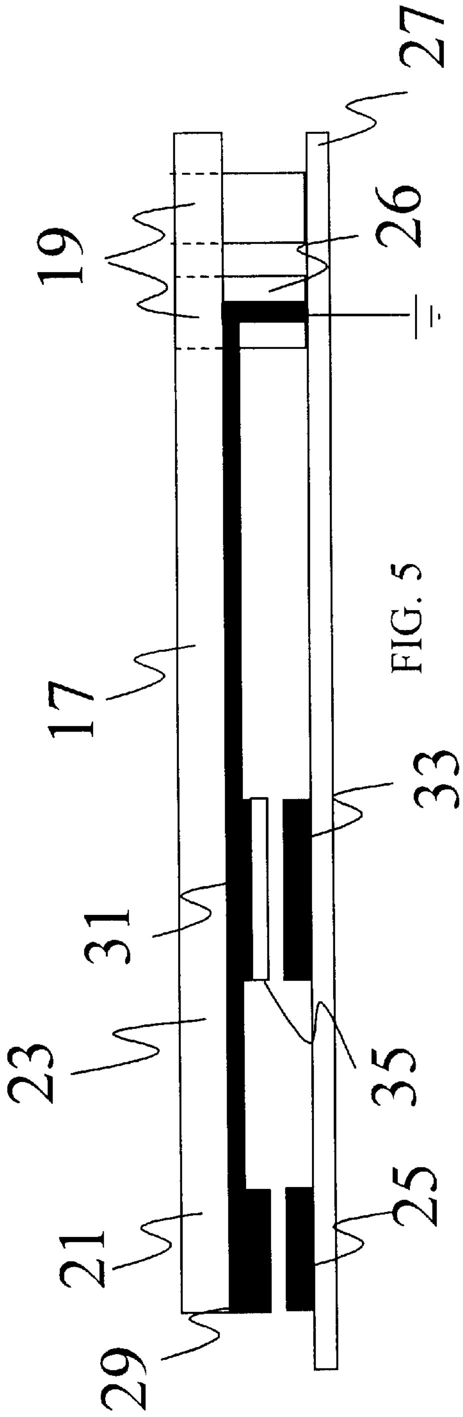
FIG. 5 is a side view of the preferred embodiment of the cantilever type device; in the "open" position.

As demonstrated in FIG. 5, the anchor end 19 of the cantilever arm 17 is mechanically attached to the top of an anchor 26, with the bottom of the anchor 26 being mechanically attached to the substrate 27. A contact strip 29 is mechanically attached to the underside of the contact end 21 of the cantilever arm 17 such that it faces, and is aligned along, the length of the transmission line 25. The actuator pads 31 and 33 are pads of an electrically conductive material. The top actuator pad 31 is mechanically attached to the underside of the cantilever arm 17 and situated such that it is in mechanical and electrical contact with the anchor 26 and the contact stripe 29. The bottom actuator pad 33 is situated directly beneath the top actuator pad 31 and is mechanically attached to the substrate 27. When the device is in the "open" position, there is insufficient signal amplitude on transmission line 25 and pad 33 to cause by electrostatic attraction flexion of the cantilever. In this "open" position, there exists an airgap between the actuation pads 31 and 33, and between the contact stripe 29 and the microstrip 25.

Figure 6:
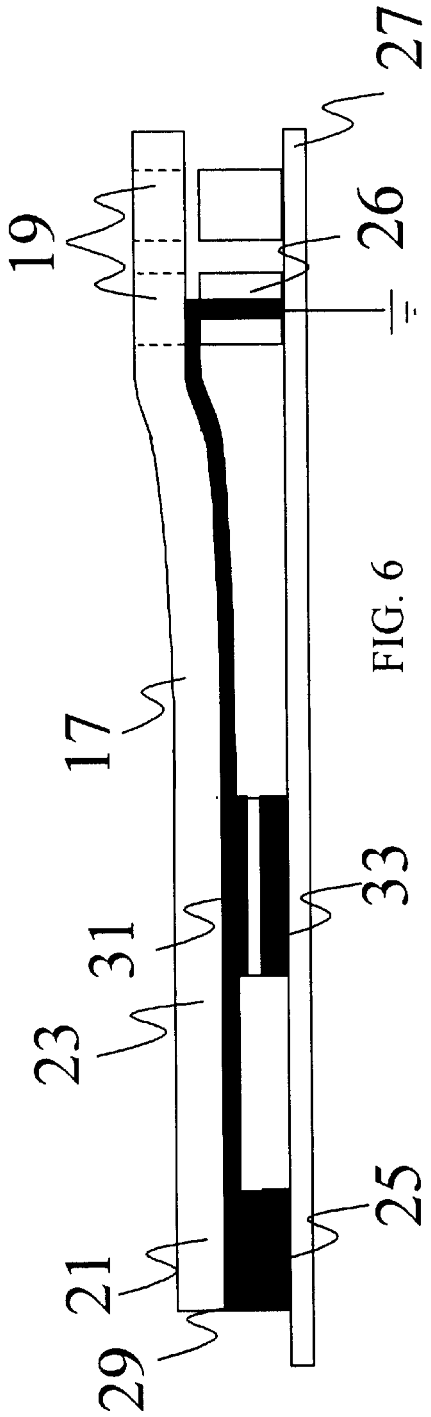
FIG. 6 is a side view of the preferred embodiment of the cantilever type device in the "closed" position.

FIG. 6 shows the operation of the device when a sufficiently large signal is applied to the bottom actuation pad 33. In this scenario, a capacitance is created such that the top actuation pad 31 is drawn toward the bottom actuation pad 33, resulting in contact between the contact stripe 29 and the microstrip 25.

Figure 7:
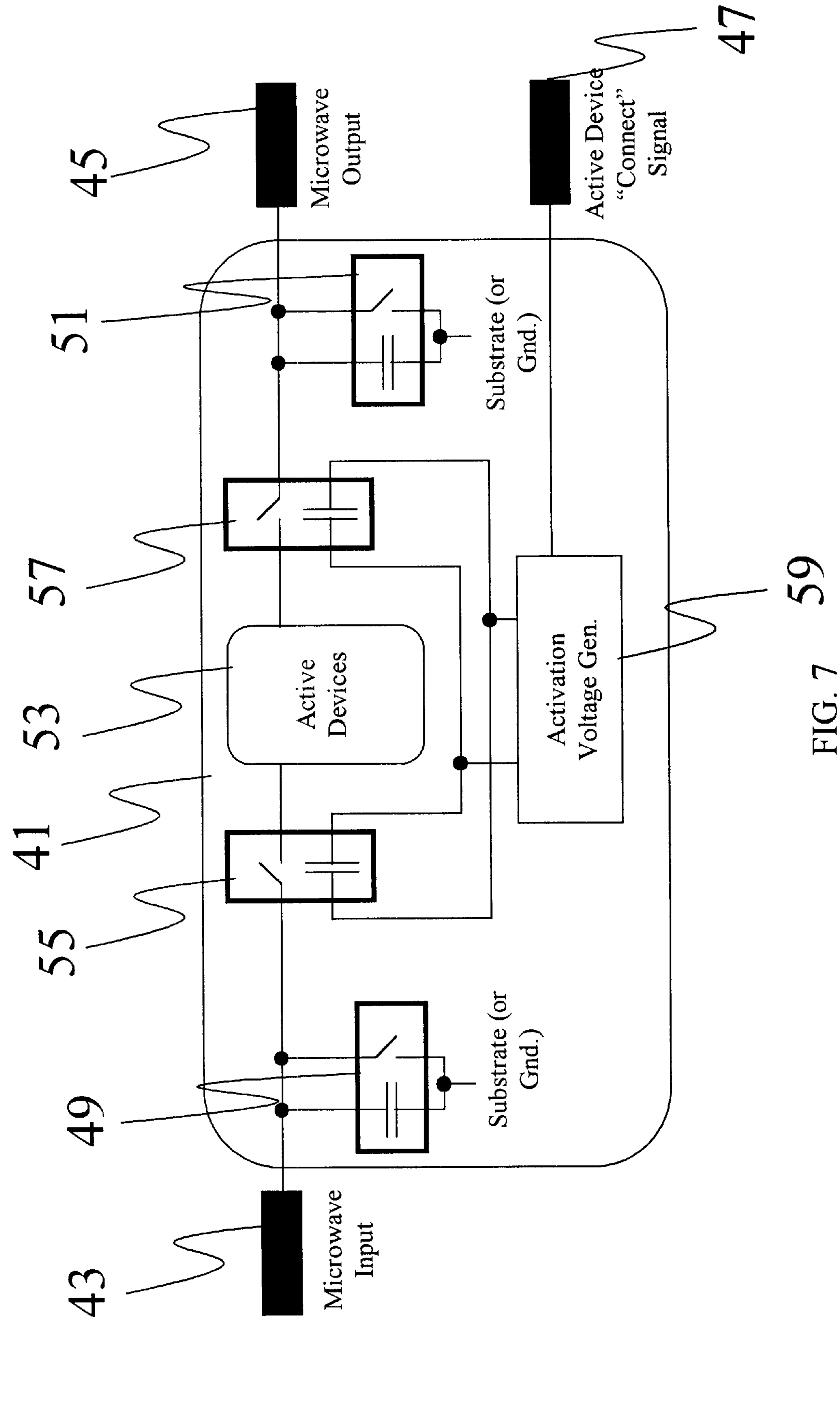
FIG. 7 is a circuit diagram including a voltage-signal source and incorporating the ESD protection device and power limiter of the present invention.

FIG. 7 is a circuit diagram including a voltage-signal source 59 and incorporating the ESD protection device and power limiter of the present invention. Devices 49 and 51 could be ESD protection devices of the present invention or the power limiter of the present invention depending on the design considerations. On/off switch devices 55 and 57 are series switches used to "disconnect" the active devices from the rest of the circuit and environment in order to protect the active devices from signals or ESD until it is desired to use the active devices within the complete system. Upon receiving a "connect" signal from the complete circuit or system, signal source 59 is used to generate the appropriate signal to cause on/off switch devices 55 and 57 to close the switch contacts.

Figure 8:
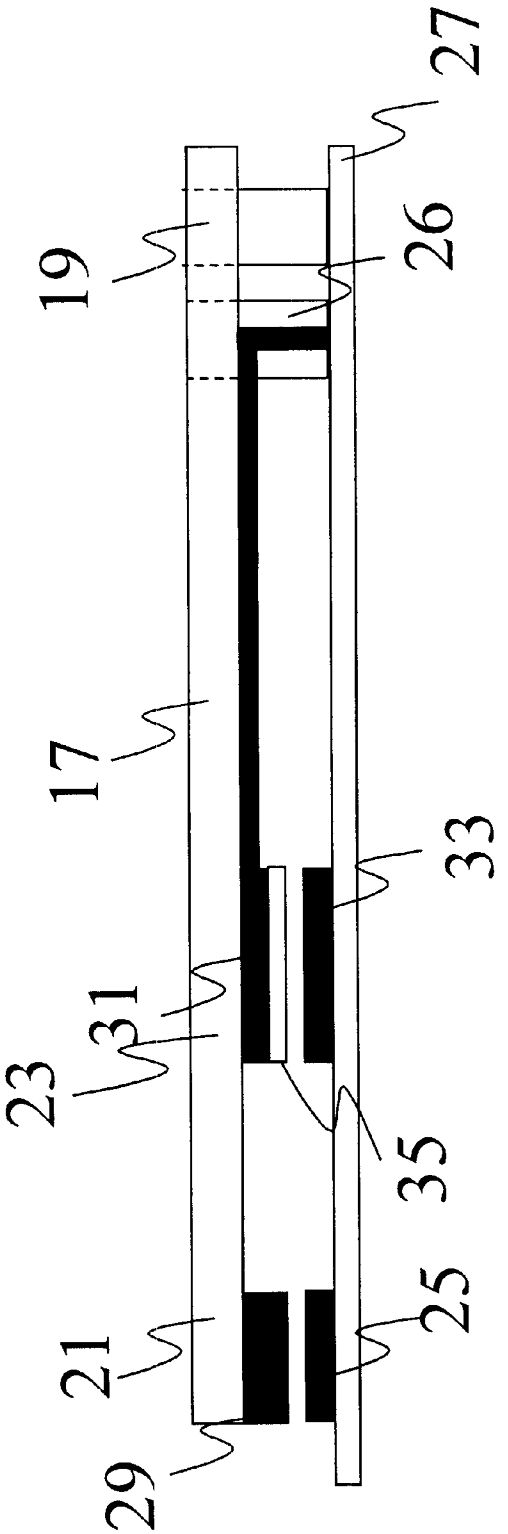
FIG. 8 shows the application of the preferred embodiment of the series switch protection device.

FIG. 8 shows the application of the preferred embodiment of the ESD protection device in the context of a simple system. The system 41, has a microwave input 43 with a microwave output 45 and an active device "connect" signal 47 serving as outputs to the system. In the input protection embodiment 49, the protection device protects the active devices 53 from unwanted signals from the microwave input 43 by shorting the unwanted signals to ground. In the output protection embodiment, the protection device protects devices within the system 41 from unwanted signals generated outside the system 41. The control signals for the input and output protection embodiment s may come from a number of sources, dependant primarily upon design goals. Another embodiment of the ESD protection device is its use of an "on/off" switch for active devices and their output. On/off switch devices 55 and 57 are configured to allow the passage of a signal from the microwave input 43 to the active devices 53, and from the active devices 53 to the microwave output 45, respectively, upon activation to the "on" position. Activation of the on/off switch devices 55 and 57 takes place via an activation voltage generator 59, which, in turn is activated upon receipt of an active device "connect" signal 47 from a source outside the system 41.

What is claimed is:

1. A power limiter having:

a. a substrate having a top side, a bottom side and via holes, the top side of the substrate having ground contacts of an electrically conductive material formed thereon, and the bottom side of the substrate having a ground metallization layer formed thereon, said via holes electrically contacting said ground contacts, and forming openings between the top side and the bottom side of the substrate, said via holes including means by which an electrical connection is formed between the ground contacts and the ground metallization layer;

b. a transmission line in the form of a strip of electrically conductive material formed on the top side of the substrate, said microstrip passing substantially between the via holes; and c. an air bridge formed of a substantially elongated strip of an electrically conductive ductile material having end portions and a center portion, the end portions of the strip being electrically and mechanically attached to the ground contacts of the substrate such that the air bridge forms an electrical connection between the ground contacts of the substrate, thereby forming a ground contact, said air bridge further formed such that the center portion is arched upward, passing over the transmission line on the top side of the substrate, forming an air gap therebetween such that when an undesirable signal is generated on the microstrip, the capacitance created causes the air bridge to flex towards the microstrip physically and electrically contacting said microstrip, thus shorting the undesirable signal to ground by passing the signal through the electrically conductive air bridge, through the ground contacts and the via holes to the ground metallization layer.

2. A power limiter as set forth in claim 1 wherein:

a. the substrate consists of a layer of an electrically neutral material such as gallium arsenide, having a top side and a bottom side;

b. a via hole consisting of a conical shaped aperture in the substrate, continuous from the top side of the substrate to the bottom side of the substrate; and c. a ground plane consisting of electrically conductive material mechanically attached to the bottom side of the substrate and electrically connected to a ground source.

3. A power limiter including:

a. a substrate having a side with at least one ground contact of an electrically conductive material formed thereon, and a substantially planar transmission line of an electrically conductive material formed thereon; and b. a substantially elongated strip of electrically conductive material electrically and mechanically connected to the at least one ground contact and positioned so that a portion of the substantially elongated strip is adjacent to the substantially planar transmission line and so that a gap is formed therebetween, such that when an undesirable signal is present in the substantially planar transmission line, a resultant force is created, causing the substantially elongated strip to flex toward the transmission line, physically and electrically contacting the transmission line and thus diverting the undesirable signal to ground by passing the signal through the substantially elongated strip to the at least one ground contact.

4. A power limiter including:

a. a substrate having a side with plurality of metallization contacts of an electrically conductive material formed thereon, and a substantially planar transmission line of an electrically conductive material formed thereon, the substantially planar transmission line including a first side and a second side, said plurality of metallization contacts formed such that a portion of the metallization contacts reside on either side of the transmission line; and b. a resilient substantially arc-shaped strip including at least one layer of electrically conductive material electrically and mechanically connected to a portion of the plurality of metallization contacts on both sides of the substantially planar transmission line and positioned so that a portion of the substantially arc-shaped strip is adjacent to the substantially planar transmission line and so that a gap is formed therebetween, such that when an undesirable signal is present in the substantially planar transmission line, a resultant force is created, causing the substantially arc-shaped strip to flex toward the transmission line, physically and electrically contacting the transmission line and thus diverting the undesirable signal by passing the signal through the substantially arc-shaped strip to the at least one metallization contact.

5. A power limiter as set forth in claim 4, wherein the metallization contacts are connected to ground.

6. A power limiter as set forth in claim 4, wherein a DC voltage is applied to the metallization contacts on either side of the substantially planar transmission line such that the DC potential affects the power level required along the substantially planar transmission line for flexion of the arc-shaped strip into electrical contact with the substantially planar transmission line.

7. A power limiter as set forth in claim 4, wherein a portion of the resilient substantially arc-shaped strip is formed of an electret material such that the power level required for flexion of the arc-shaped strip is affected by the built-in charge of the electret.

* * * * *